(12) United States Patent
Kim et al.

(10) Patent No.: US 8,659,131 B2
(45) Date of Patent: Feb. 25, 2014

(54) STRUCTURE FOR MULTI-ROW LEAD FRAME AND SEMICONDUCTOR PACKAGE CAPABLE OF MINIMIZING AN UNDER-CUT

(75) Inventors: Ji Yun Kim, Gyeonggi-do (KR); Hyun Sub Shin, Daegu (KR); Sung Won Lee, Seoul (KR); Hyung Eui Lee, Gyeonggi-do (KR); Yeong Uk Seo, Gyeonggi-do (KR); Sung Wuk Ryu, Seoul (KR); Hyuk Soo Lee, Gyeonggi-do (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/121,018

(22) PCT Filed: Sep. 25, 2009

(86) PCT No.: PCT/KR2009/005481
§ 371 (c)(1),
(2), (4) Date: Jun. 7, 2011

(87) PCT Pub. No.: WO2010/036051
PCT Pub. Date: Apr. 1, 2010

(65) Prior Publication Data
US 2011/0227208 A1    Sep. 22, 2011

(30) Foreign Application Priority Data

Sep. 25, 2008  (KR) .................. 10-2008-0094042
Oct. 14, 2008  (KR) .................. 10-2008-0100406
Oct. 22, 2008  (KR) .................. 10-2008-0103390

(51) Int. Cl.
*H01L 23/495* (2006.01)

(52) U.S. Cl.
USPC ............ 257/676; 257/666; 257/E23.031; 257/E23.041; 257/E23.043; 257/E23.07

(58) Field of Classification Search
USPC ................. 257/666, 676, E23.031, E23.041, 257/E23.043, E23.07
See application file for complete search history.

(56) References Cited

U.S. PATENT DOCUMENTS

| | | | | |
|---|---|---|---|---|
| 5,230,144 A | * | 7/1993 | Ootsuki | 29/827 |
| 5,367,191 A | * | 11/1994 | Ebihara | 257/666 |
| 5,633,205 A | * | 5/1997 | Tsuchiya et al. | 29/827 |
| 5,653,891 A | * | 8/1997 | Otsuki et al. | 216/11 |
| 5,656,550 A | * | 8/1997 | Tsuji et al. | 438/123 |

(Continued)

FOREIGN PATENT DOCUMENTS

| | | |
|---|---|---|
| CN | 1365141 A | 8/2002 |
| CN | 1942057 A | 4/2007 |

(Continued)

OTHER PUBLICATIONS

Office Action dated Dec. 21, 2012 in Chinese Application No. 200980147033.6, filed Sep. 25, 2009.

*Primary Examiner* — Ida M Soward
(74) *Attorney, Agent, or Firm* — Saliwanchik, Lloyd & Eisenschenk

(57) ABSTRACT

The present invention relates to structure and manufacture method for multi-row lead frame and semiconductor package, the method characterized by forming a pad portion on a metal material (first step); performing a surface plating process or organic material coating following the first pattern formation (second step); forming a second pattern on the metal material (third step); and packaging a semiconductor chip following the second pattern formation (fourth step), whereby an under-cut phenomenon is minimized by applying a gradual etching.

3 Claims, 16 Drawing Sheets

(56) References Cited

U.S. PATENT DOCUMENTS

| | | | |
|---|---|---|---|
| 5,683,943 A * | 11/1997 | Yamada | 216/14 |
| 5,738,928 A * | 4/1998 | Kodani et al. | 428/141 |
| 5,901,436 A * | 5/1999 | Ohsawa et al. | 29/827 |
| 6,007,668 A * | 12/1999 | Kodani et al. | 156/295 |
| 6,008,068 A * | 12/1999 | Yamada | 438/111 |
| 6,025,640 A * | 2/2000 | Yagi et al. | 257/666 |
| 6,031,292 A * | 2/2000 | Murakami et al. | 257/778 |
| 6,051,450 A * | 4/2000 | Ohsawa et al. | 438/123 |
| 6,130,027 A | 10/2000 | Hamada | 430/312 |
| 6,240,632 B1 * | 6/2001 | Ito et al. | 29/827 |
| 6,740,961 B1 * | 5/2004 | Mostafazadeh | 257/676 |
| 7,053,492 B2 | 5/2006 | Takahashi et al. | 257/783 |
| 7,247,526 B1 * | 7/2007 | Fan et al. | 438/123 |
| 7,411,280 B2 * | 8/2008 | Yazid et al. | 257/676 |
| 7,777,310 B2 * | 8/2010 | Punzalan et al. | 257/676 |
| 7,936,055 B2 * | 5/2011 | Dimaano et al. | 257/676 |
| 7,939,379 B2 * | 5/2011 | Youn et al. | 438/123 |
| 8,063,470 B1 * | 11/2011 | Sirinorakul et al. | 257/666 |
| 8,084,299 B2 * | 12/2011 | Tan et al. | 438/111 |
| 8,120,152 B2 * | 2/2012 | Chang Chien et al. | 257/676 |
| 2005/0040502 A1 * | 2/2005 | Cherian | 257/666 |
| 2007/0017090 A1 | 1/2007 | Sakai et al. | |
| 2009/0085177 A1 * | 4/2009 | Pisigan et al. | 257/666 |
| 2009/0200265 A1 * | 8/2009 | Chang | 216/39 |
| 2010/0072591 A1 * | 3/2010 | Camacho et al. | 257/676 |
| 2011/0057298 A1 * | 3/2011 | Ramos et al. | 257/667 |

FOREIGN PATENT DOCUMENTS

| | | |
|---|---|---|
| CN | 101192599 A | 6/2008 |
| JP | 3-161960 A | 7/1991 |
| JP | 06-179088 A | 6/1994 |
| JP | 07-321268 A | 12/1995 |
| JP | 10-270618 A | 10/1998 |
| JP | 2000-034583 A | 2/2000 |
| JP | 2001-024135 A | 1/2001 |
| JP | 2004-071899 A | 3/2004 |
| JP | 2005-317998 A | 11/2005 |
| JP | 2007-023338 A | 2/2007 |
| JP | 2007-048978 A | 2/2007 |

\* cited by examiner

Fig. 5
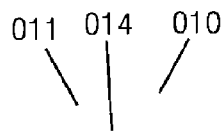
(a)
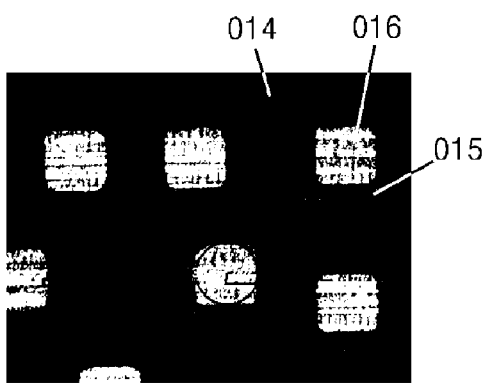
(b)
Fig. 6
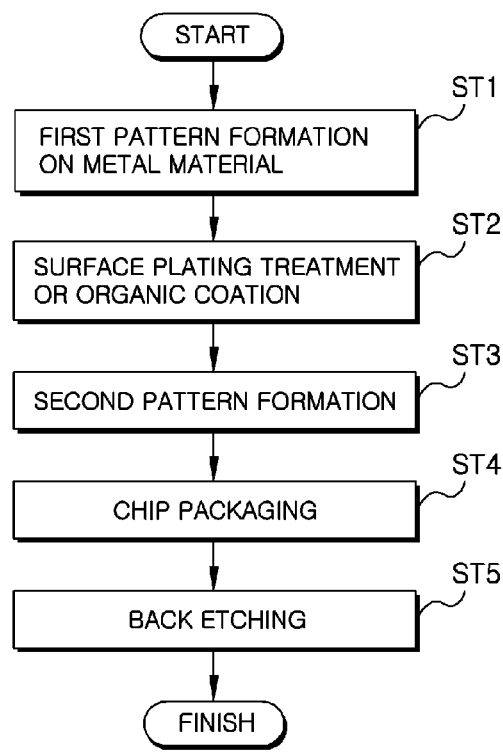

Fig. 8
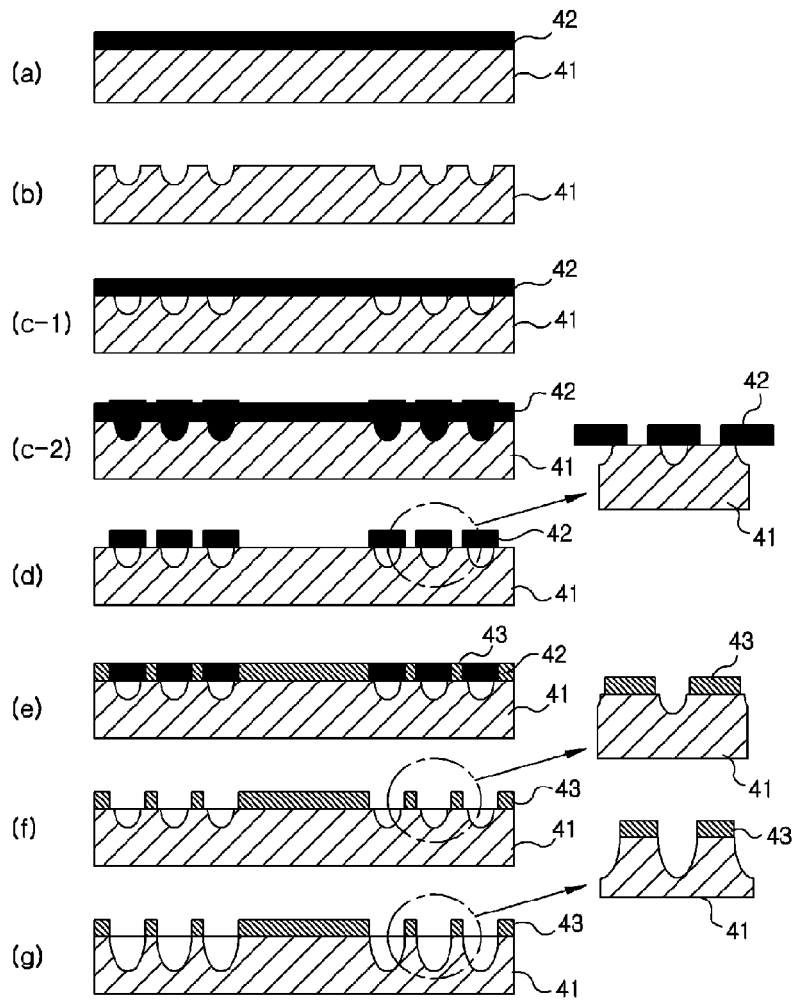
Fig. 9
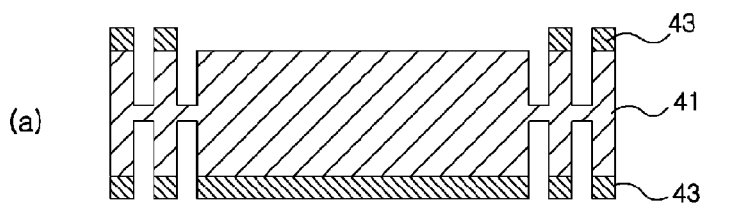
CONVENTIONAL TYPE
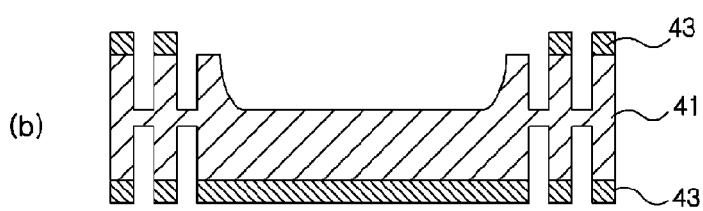
SEMICONDUCTOR CHIP EMBEDED TYPE (a) CONVENTIONAL TYPE (b) SEMICONDUCTOR CHIP EMBEDED TYPE

MULTI-ROW LEAD FRAME(50)

(a) PRIOR ART  w1 = w2

(b) PRESENT INVENTION  w1 < w2

Fig. 20
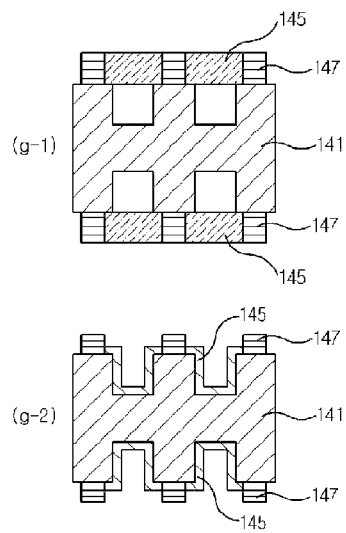
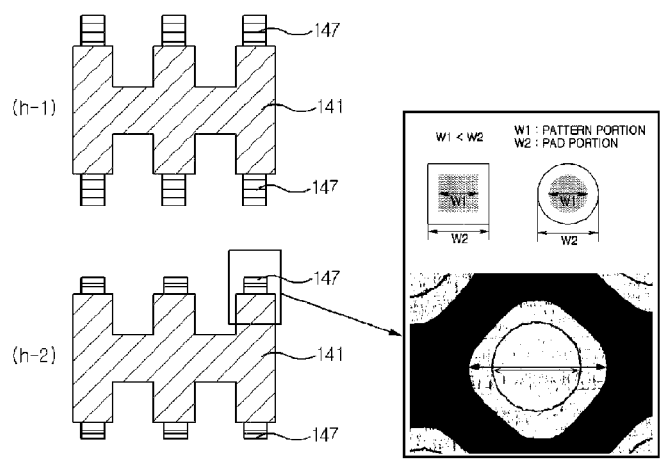
Fig. 21
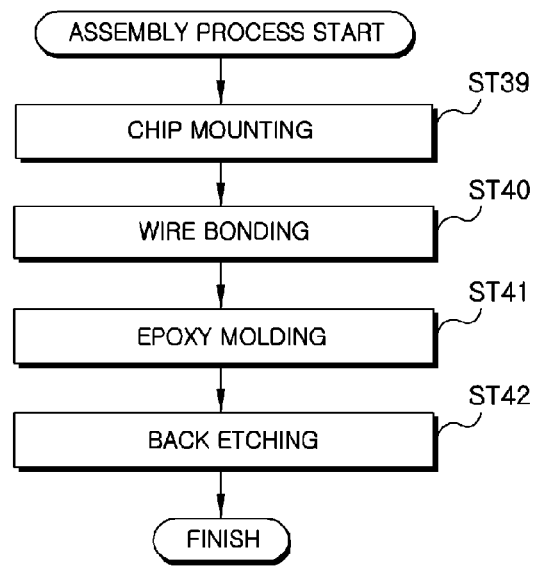

Fig. 25
(a)
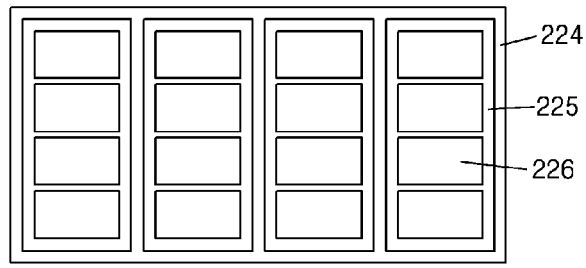
ONE COMPLETE SHEET FIRST ETCHING
(b)
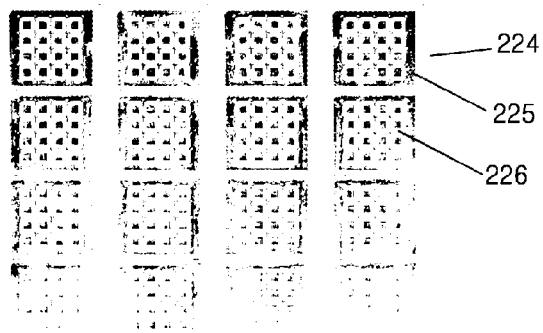
Fig. 26
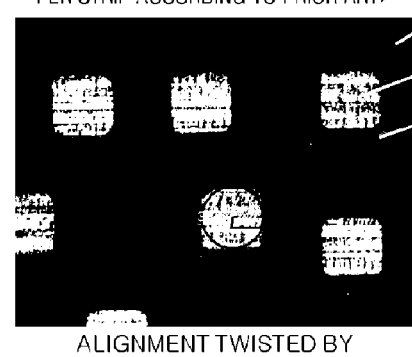
<PATTERN FORMATION BY SHEET SEPARATED PER STRIP ACCORDING TO PRIOR ART>
ALIGNMENT TWISTED BY 38.67um
(a)
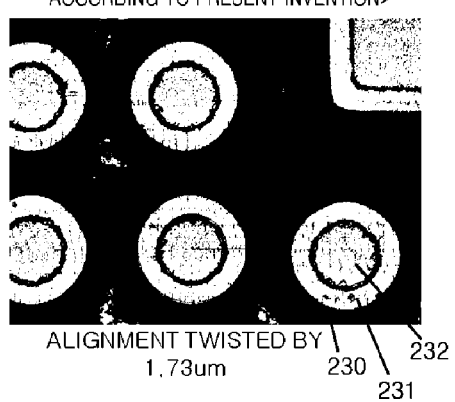
<PATTERN FORMATION PER SHEET ACCORDING TO PRESENT INVENTION>
ALIGNMENT TWISTED BY 1.73um
(b)

STRUCTURE FOR MULTI-ROW LEAD FRAME AND SEMICONDUCTOR PACKAGE CAPABLE OF MINIMIZING AN UNDER-CUT

CROSS-REFERENCE TO RELATED APPLICATIONS

This application is the U.S. national stage application of International Patent Application No. PCT/KR2009/005481, filed Sep. 25, 2009, which claims priority to Korean Application Nos. 10-2008-0094042, filed Sep. 25, 2008, 10-2008-0100406, filed Oct. 14, 2008, and 10-2008-0103390, filed Oct. 22, 2008, the disclosures of each of which are incorporated herein by reference in their entirety.

TECHNICAL FIELD

The present invention relates to semiconductor chip package, and more particularly to structure and manufacture method for multi-row lead frame and semiconductor package capable of minimizing an under-cut phenomenon by applying a gradual etching.

The present invention also relates to active element-embedded lead frame, semi-conductor package and manufacture method of semiconductor package capable of performing an antioxidation (anti-tarnish) treatment by selectively forming a surface treatment layer following an etching process for embedding a basic circuit and semi-conductor chip active element, to effectively prevent pad loss or dimensional shrinkage phenomenon caused by undercut phenomenon.

The present invention further relates to structure and manufacture method for multi-row lead frame and semiconductor package capable of using a sheeted etching product dispensing with a first etching product in which strip is cut off for pattern formation, whereby alignment can be easily performed, fine pattern formation for input/output terminal can be facilitated to prevent occurrence of undercut phenomenon and processional application is eased to increase the process pace.

BACKGROUND ART

Generally, a semiconductor chip package alone cannot receive electricity from outside to transmit or receive an electric signal, such that it is necessary to package a semiconductor chip to allow the semiconductor chip to receive the electric signal from and transmit the electric signal to the outside.

Recently, as the semiconductor chip package is manufactured in various configurations using various members such as lead frames, printed circuit boards and circuit films in consideration of reduced size of chip, heat emitting capacity and improved electrically performing capacity, improved reliability and manufacturing cost.

Furthermore, it is necessary to increase the number of input/output terminals (electrical leads) between the semiconductor chip and outside circuit substrate in response to super-integration of semiconductor chips. To this end, a semiconductor chip package of multi-row lead frame mounted with leads having 2 or more rows that separately connect the chip with outside circuit is receiving attention and interest.

FIG. 1 is a conceptual diagram illustrating a process of manufacturing a semi-conductor device according to the conventional manufacturing method of semi-conductor devices.

Referring to FIG. 1 (a), a predetermined thickness of lead frame material (23) consisting of copper, copper alloy or steel alloy is prepared. The surface of the lead frame material is coated using a first and second resist film (24, 25) in FIG. 1 (b), and photolithography treatment and development treatment are performed on the first and second resist films (24, 25) in FIG. 1 (c). The surface side of the lead frame material (23) is formed with junction terminals (14, 14a) of bonding wire (15) from the semi-conductor device (13) and an external wiring pattern (26) that has exposed a lead (17) portion bonded to the junction terminals (14, 14a). Furthermore, a rear side of the lead frame material (23) is formed with a rear wiring pattern (27) that has exposed a portion that becomes a terminal pad (11).

Referring to FIG. 1 (d), a noble metal plating (21. etching-resistant plating treatment) is performed on the surface exposed portion of the lead frame material (23) formed with the external and rear wiring patterns (26, 27) according to the first and second resist films (24, 25). The noble metal platings (20, 21) are not solved in the etching solution that is used in the subsequent processes and act as etching-resistant plating film.

Now, referring to FIG. 1 (e), the second resist film (25) at the rear side is removed, and in FIG. 1 (f), a half etching is performed on a rear side of the lead frame material (23) where the noble metal platings (20, 21) act as etching-resistant resist film. At this time, the surface side of the lead frame material (23) is covered with the noble metal plating (20) and the first resist film (24) to half-etch only the exposed portion of the internal wiring pattern (27) formed by the second resist film (25) and to form a concave portion (29).

It is sufficient to allow the depth of the half etching being at 4/5 to 1/2 of the thickness of the lead frame material (23). Thereby, a portion that becomes a terminal pad (11) arranged on a grid alignment becomes protruded.

Now, referring to FIG. 1 (f), the first resist film (24) at the surface side is removed. In FIG. 1 (h), resin (19) is injected into the half-etched concave portion (29) at the rear side using a mold device. In using the mold device, there is a gap between the mold and a surface with the noble metal plating (21) that becomes the terminal pad (11), and the gap may dirty the surface of the terminal pad (11) due to resin. Therefore, the molding process should be so performed as to allow the gap to narrow to a minimum allowable level (e.g., less than 10 micrometer).

As a result, the each terminal pad (11) is connected to the resin (19). Furthermore, separation of the first resist film (24) at the surface side may be performed after the resin (19) is injected into the concave portion (29).

Now, referring to FIG. 1 (i), an etching treatment is performed on the surface of the lead frame material (23). At this time, the noble metal plating (20) on the surface of the lead frame material (23) acts as a etching-resistant resist film, such that each junction terminal (14) and the junction terminal (14a) that is bonded to each lead (17) are electrically separated in non-bonding state. The each separated junction terminal (14, 14a) and the lead (17) are connected to the resin (19) to form a lead frame base (12).

Now, referring to FIG. 1(j), a semiconductor device (13) is centrally mounted on the lead frame base (12) formed through the aforementioned processes, and a wire bonding process is performed in which each electrode pad (22) of the semiconductor device (13) and the junction terminals (14, 14a) are connected by a bonding wire (15).

Furthermore, the lead frame base (12), the semiconductor device (13) and the bonding wire (15) are packaged while the terminal pad (11) is exposed at a rear surface using a mold device (not shown), whereby the semiconductor device (10) is completed. At this time, the surface of the terminal pad (11) exposed at the rear surface thereof may be padded by noble metal plating or welding, where the resin (19) at the rear surface may be partially removed by using chemicals or laser beam to protrude the terminal pad (11).

Now, referring to FIG. 1 (*k*), separation of the semiconductor device (10) arranged in parallel on a grid is performed to complete each semiconductor device (10).

In case of the existing semiconductor package substrate, particularly a metal substrate having an excellent heat emitting effect and electrical characteristic, in order to realize a die pad formed with a circuit of multi-row I/O (input/output) pad of various designs and packaged with chips, a circuit is realized by a way in which a surface treatment plating (typically Ni/Au) for wire bonding or soldering is performed, and photoresist is removed through etching.

Thereafter, a semiconductor chips are packaged via wire bonding in the assembly process and an epoxy mold compound is used to process the molding, and finally, a metal carrier material at a lower substrate-bonded portion is removed by etching to thereby complete the semiconductor device, whereby a multi-row I/O pad of portion size is made for an excellent thermal relief and electrical characteristic.

However, the conventional technique suffers from a disadvantage in that the plating is progressed following resister formation on etching, such that the etching solution creeps into a lateral surface of the etched resister metal layer when a circuit is formed to generate an undercut, thereby making it difficult to realize a circuit of a desired dimension. Another disadvantage is that the realized circuit is structurally weak, whereby separation or omission is generated to reduce the yield.

FIG. 2 is a drawing illustrating an example of a typical failure that is generated when a semiconductor device is manufactured according to the method of FIG. 1, where reference numeral 31 of FIG. 2 (*a*) is a metal material, 32 is an exemplary etching resist of Ni/Au layer, and 33 is a lower structure weakened by undercut, and where reference numeral 34 of FIG. 2 (*b*) is a normal pad and 35 is a loss pad. As noted, due to generation of undercut (33) in FIG. 2 (*a*), a failure such as the loss pad (35) of FIG. 2 (*b*) lowers the yield and deteriorates reliability of a circuit.

Furthermore, in the conventional technologies, especially where a substrate is employed using a metal material having an excellent heat emitting effect and an electrical characteristic, a photosensitive resist is employed for realizing a die pad packaged with chips and a circuit formation having a multi-row pad of various designs, a surface treatment plating for wire bonding or soldering is performed, photoresist is removed and a circuit is manufactured via an etching, whereby an excellent thermal relief and electrical characteristic relative to the multi-row I/O pad of portion size is realized.

However, when a circuit is configured by forming a resist to the etching to proceed the plating, etching solution is crept into a lateral surface of the etching resist metal layer to generate an undercut, whereby it is difficult to form a circuit of a desired dimension. Furthermore, the formed circuit is structurally weak to reduce the yield due to separation or omission during a high pressure rinsing at the assembly process.

In general, a semiconductor package suffers from a disadvantage in that a semi-conductor chip itself cannot receive an electricity from outside to receive or transmit an electric signal, such that chips are needed to be packaged for allowing the semi-conductor chips to receive from outside or transmit to outside various electric signals. Recently, in consideration of higher degrees of dimensional shrinkage of chips, improved thermal emission capacity and electric performance capacity, improved reliability and manufacturing cost, the semiconductor chips are manufactured in various configurations using lead frames, printed circuit boards, and circuit film.

Concomitant with tendency toward a semiconductor chip having a micro-size and a high integration degree, there is a need of increasing the number of I/O terminals of electrical leads between the semiconductor chip and an external circuit substrate. To this end, a semiconductor package of multi-row leadless frame is focused that is mounted with leads having two or more rows separately connecting the semiconductor chips with external circuit.

FIG. 3 is a flowchart illustrating a method of manufacturing a multi-row leadless frame and a semiconductor package using the conventional strip cut etching product.

The method is performed in the following manner. First of all, an initial etching is performed per strip portion relative to sheet (ST01). Lamination on both sides is performed to form a circuit (ST02). Plating is performed (ST03), and separation is performed to manufacture a multi-row leadless frame (ST04).

Once the multi-row leadless frame is manufactured, cutting is performed per chip portion, epoxy molding is performed and then a semiconductor package is completed (S505).

FIG. 4 is a conceptual drawing illustrating a manufacturing process according to FIG. 3, where FIG. 4(*a*) illustrates a first etching by strip portion at a strip cutting portion (011) relative to a sheet (010), FIG. 4(*b*) illustrates lamination (012) of photo-sensitive material on the strip-formed sheet, and FIG. 4(*c*) illustrates exposure using a photomask (013) and plating being performed, where, the strip formed on the existing sheet and the strip pushed aside by the lamination are different in positions thereof when the photosensitive material is exposed by photomask, thereby failing to form a proper pattern. In other words, a misalignment as much as 'W' in FIG. 4(*c*) is generated as a pattern failure.

FIG. 5 (*a*) is a plain view illustrating a sheet cut in strip portion from FIG. 4 (*a*), FIG. 5 (*b*) is a drawing illustrating an example of an improper pattern alignment due to failure to fix the strips, where reference numeral 014 is a formed semiconductor package, 015 is a metal material and 016 is a plated layer formed on the metal material.

As shown in FIG. 5(*b*), it can be noted that the plated layer (016) formed on the metal material (015) is not centrally formed on the metal material (015), whereby the pattern alignment is formed in a upwardly biased state from the center of the metal material (015).

As apparent from the foregoing, the conventional multi-row leadless frame has a disadvantage in that pattern formation experiences a difficulty due to a Cu device forming the strips being not fixed, because cutting is made based on strip portion when pattern process is performed per sheet. That is, the strip portion of a pattern portion in FIG. 5 is not fixed to lead to an improper pattern alignment during mask exposure.

DISCLOSURE OF INVENTION

Technical Problem

It is an object of the present invention to provide a structure and manufacture method for multi-row lead frame and semiconductor package capable of minimizing an undercut phenomenon by applying a gradual etching.

It is another object of the present invention to provide an active element-embedded lead frame, semiconductor package and manufacture method of semiconductor package capable of performing an antioxidation treatment by selectively forming a surface treatment layer following an etching process for embedding a basic circuit and semiconductor chip active element, to effectively prevent pad loss or dimensional shrinkage phenomenon caused by undercut phenomenon.

It is still another object of the present invention to provide a structure and manufacture method for multi-row lead frame and semiconductor package capable of using a sheeted etching product dispensing with a first etching product in which strip is cut off for pattern formation, whereby alignment can be easily performed, fine pattern formation for I/O (input/output) terminal can be facilitated to prevent occurrence of undercut phenomenon and processional application is eased to increase the process pace.

Solution to Problem

According to an aspect of the present invention, there is provided a manufacturing method of lead frame, the method comprising: forming a pad portion on a metal material (first step); coating a photosensitive material, performing a surface plating process or organic material coating following exposure/development to form an etching resistor layer (second step); and removing the photosensitive material to perform an etching (third step).

In some exemplary embodiment of the present invention, the first step may include coating photosensitive material on the metal material and performing the exposure/development/etching to form a pad portion.

In some exemplary embodiment of the present invention, the photosensitive material in the first step or the second photosensitive material of the second step may be a film or liquid photosensitive material.

In some exemplary embodiment of the present invention, the third step may include performing the etching of the plated or organic coating layer as a mask.

In some exemplary embodiment of the present invention, the third step may include forming a length of undercut at the etched resister layer smaller than the etched depth.

According to another aspect of the present invention, there is provided a manufacturing method of lead frame, comprising: forming a pad portion on a metal material (first step); and coating photosensitive material on the metal material and performing a surface plating treatment or organic coating following the exposure/development to form a etching resistor layer having a width narrower than that of the pad portion (second step).

In some exemplary embodiment of the present invention, the first step may include coating the photosensitive agent on the metal material, performing exposure and development using a mask and performing the etching to form the pad portion.

In some exemplary embodiment of the present invention, the second step may include performing a roof-shaped photosensitive material coating or a protective photosensitive material coating when the photosensitive material is coated.

In some exemplary embodiment of the present invention, the second step may include performing a surface treatment plating during surface treatment, where the plating may use a single alloy from one of an electrolyte or non-electrolyte Ni, Pd, Au, Sn, Ag, Co and Cu, or a binary alloy or ternary alloy, and may be in a single layer or a double layer.

According to still another aspect of the present invention, there is provided a manufacturing method of lead frame, comprising; performing a first etching per sheet (first step); forming a circuit following lamination and the first step, and performing a plating treatment and separation treatment (second step); and cutting per strip following the second step (third step).

In some exemplary embodiment of the present invention, the first step may include coating a photosensitive agent on a metal material per sheet, performing exposure/development using a mask and performing an etching.

In some exemplary embodiment of the present invention, the second step may include coating a photosensitive material on the metal material and performing a surface plating process or an organic coating following the exposure/development.

In some exemplary embodiment of the present invention, the third step may include using at least one or more from punching, routing, laser cutting and lithography to cut the lead frame per strip.

According to still further aspect of the present invention, there is provided a vertical lead-shaped lead frame for mounting an active element, the lead frame comprising: a metal material formed with a pad portion which becomes a vertical lead in the device mounting process; and a pattern layer formed by electrolyte or non-electrolyte plating on the pad portion, where the pattern layer may be such that an undercut length is formed smaller than an etched depth of the lower metal material.

According to still further aspect of the present invention, there is provided a lead frame for mounting an active element, the lead frame comprising: a metal material formed with a pad portion which becomes a lead in the element mounting process; and a pattern layer formed on the pad portion by plating, and formed in a width narrower than that of the pad portion, where the plating of the pattern layer may use a single alloy from one of an electrolyte or non-electrolyte Ni, Pd, Au, Sn, Ag, Co and Cu, or a binary alloy or ternary alloy, and may be in a single layer or a double layer.

According to still further aspect of the present invention, there is provided a lead frame for mounting an active element, the lead frame comprising: a metal material formed with a pad portion which becomes a lead in the element mounting process; and a pattern layer formed on the pad portion by electrolyte or non-electrolyte plating, where an alignment bias formed by a central point of the pattern layer and that of the pad portion is less than 38.67 um, and where the alignment bias/pattern width may be less than 0.11.

Advantageous Effects of Invention

The advantageous effect is that the leadless chip carrier lead frame that has gone through the manufacturing method according to the present invention is not formed by plating, unlike the conventional lead frame, and carrier material that is used in the plating process is not completely removed to thereby increase the quality, productivity and cost reduction.

Another advantageous effect is that a gap between a die pad portion and a lead is narrowed to enable a cost reduction and an improved electric characteristic. Furthermore, it is possible to easily increase the number of terminals at a space formed between the die pad portion and the lead, which means that multiplication of terminals is possible.

Still another advantageous effect is that the lead frame manufacturing method by the conventional etching is modified to thereby enable manufacturing of multi-row lead frames, whereby a new investment burden for manufacturing multi-row lead frames can be minimized.

Still further advantageous effect is that the multi-row lead frame can greatly reduce the size and weight of lead frame compared with the conventional lead frame, and introduction of various surface treatment enables manufacturing of various lead frames such as flip chip lead frame and leadframe for system in package.

Still further advantageous effect is that etching and gradual selective etching are applied to enable realization of a circuit-width with minimized undercut.

Still further advantageous effect is that an upper side and a bottom side are coated with functional (alkali-resistant, acid-resistant) photosensitive polymer material to enable the pattern plating using various surface treatments.

Still further advantageous effect is that surface treatment layer is selectively formed and anti-oxidation is treated after an etching process for embedding a basic circuit and semi-conductor chip active element to effectively prevent pad loss and dimensional shrinkage that are caused by undercut phenomenon.

Still further advantageous effect is that embedment of active element enables increased thickness and package density of final semiconductor package in the semi-conductor package substrate that has gone through the manufacturing method according to the present invention, whereby a substrate having an excellent thermal discharge and electrical characteristic can be manufactured.

Still further advantageous effect is that the semiconductor substrate in which a copper thin film is bonded to a core layer coupled with high polymer and high polymer plus epoxy can have a structure having a cavity-shaped hole and space through etching and laser processing following the circuit formation process.

Still further advantageous effect is that a semiconductor package substrate can be manufactured in which a round pad formed by pattern surface treatment plating is introduced to realize a high-density circuit in a limited pad size.

Still further advantageous effect is that the undercut phenomenon at the pad bottom caused by etching can be completely removed, apart from the conventional method of etching after the resist formation, such that pad shrinkage resulted from pad loss and undercut generated in the conventional process can be effectively prevented.

Still further advantageous effect is that a sheeted etching product is utilized instead of a strip-cut first etching product for pattern formation to facilitate the alignment, whereby an easily-applicable, fast manufacturing method can be provided that is capable of forming fine pattern in the input/output terminal dispensing with the undercut phenomenon.

BRIEF DESCRIPTION OF DRAWINGS

FIG. 5 (a) is a plain view illustrating a sheet cut in strip portion from FIG. 4 (a) and FIG. 5 (b) is a drawing illustrating an example of an improper pattern alignment due to failure to fix the strips.

FIG. 6 is a flowchart illustrating a manufacturing method of a multi-row lead frame or a semiconductor chip package according to an exemplary embodiment of the present invention.

FIG. 8 is a process chart illustrating a manufacturing method of a multi-row lead frame or a semiconductor chip package according to another exemplary embodiment of the present invention.

FIG. 9 is a conceptual drawing illustrating an example of a conventional type and that of a semiconductor chip embedding type in a multi-row lead frame according to the present invention.

FIG. 20 is an enlarged conceptual drawing of B part in (g-1), (g-2) (h-1) and (h-2) in FIG. 19.

FIG. 21 is a flowchart illustrating a method of manufacturing a semiconductor package in the active element embedded lead frame by conducting an assembly process following the process of FIG. 18.

FIG. 25 is a plan of a first etching product from a sheet in FIG. 24 (a).

FIG. 26 (a) is an exemplary drawing that forms a pattern using a sheet separated per strip according to the conventional method, and FIG. 26(b) is an exemplary drawing that forms a pattern using a sheet according to the present invention.

BEST MODE FOR CARRYING OUT THE INVENTION

Figure 1:
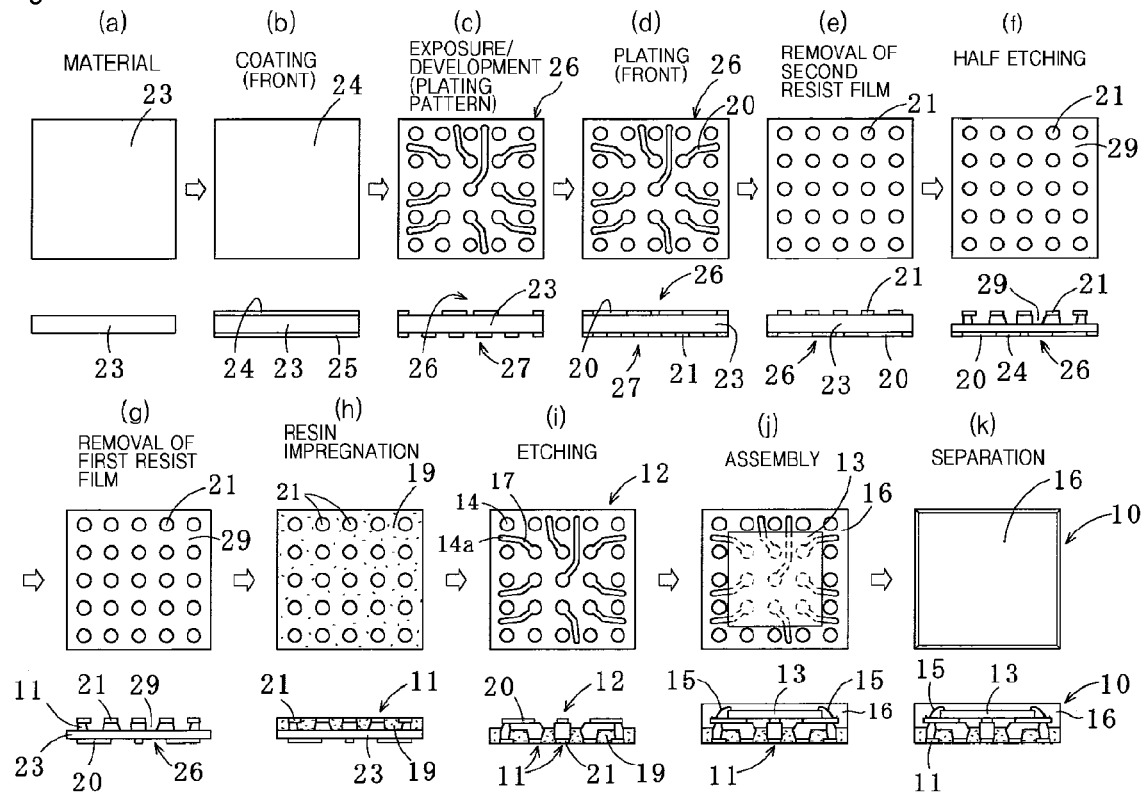
FIG. 1 is a conceptual diagram illustrating a process of manufacturing a semi-conductor device according to the conventional manufacturing method of semi-conductor devices.
Figure 2:
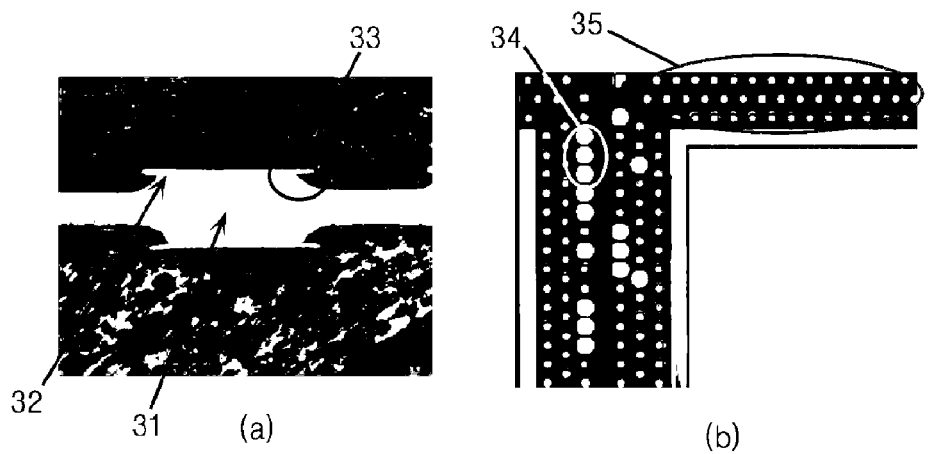
FIG. 2 is a drawing illustrating an example of a typical failure that is generated when a semiconductor device is manufactured according to the method of FIG. 1.
Figure 3:
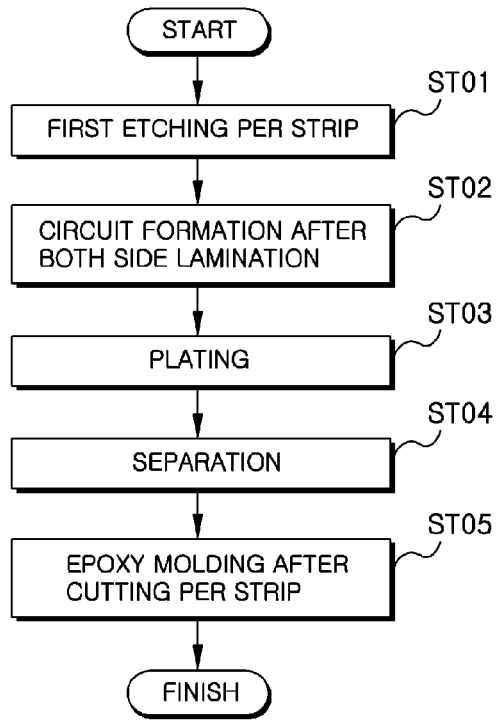
FIG. 3 is a flowchart illustrating a method of manufacturing a multi-row leadless frame and a semiconductor package using the conventional strip cut etching product.
Figure 4:
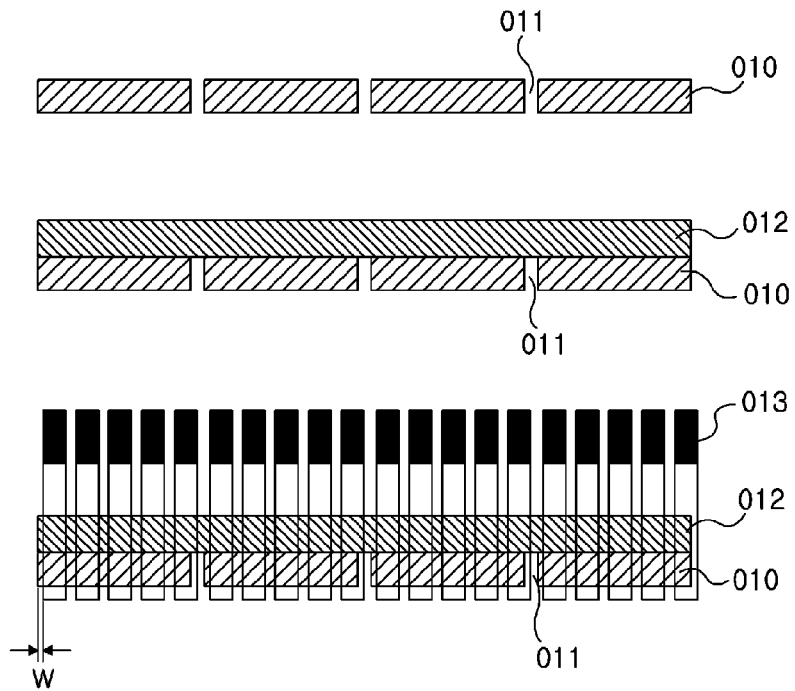
FIG. 4 is a conceptual drawing illustrating a manufacturing process according to FIG. 3.

A detailed description of exemplary embodiments of structure and manufacture method for multi-row lead frame and semiconductor package will be described in detail with reference to the accompanying drawings.

For the purpose of clarity, technical material that is known in the technical fields related to the disclosure has not been described in detail so that the disclosure is not unnecessarily obscured. The terms and phrases therefore should be defined based on the contents across an entire specification.

Furthermore, terms and phrases used in the specification and claims may be interpreted or vary in consideration of construction and use of the present invention according to intentions of an operator or customary usages. The terms and phrases therefore should be defined based on the contents across an entire specification.

First Exemplary Embodiment

The present invention according to a first exemplary embodiment is intended to minimize an undercut phenomenon by applying a gradual etching.

FIG. 6 is a flowchart illustrating a manufacturing method of a multi-row lead frame or a semiconductor chip package according to an exemplary embodiment of the present invention.

First of all, a metal material (41) is coated with a photosensitive material (42) to which exposure/development/etching are performed to form a first pattern on the metal material (41). At this time, the metal material (41) is a lead frame raw material (ST1).

Following the formation of the first pattern, a surface plating treatment or organic coating is performed (ST2). Furthermore, plating or organic coating layer is etched as a mask to form a second pattern on the metal material (41) forming a second pattern on the metal material (41) (ST3).

A semiconductor chip (44) is bonded to an upper portion of the metal material (41) packaged with a die pad portion (51) using an adhesive following the second pattern formation, and a packaging is performed by performing wire bonding (45) and epoxy molding (46) to constitute a semiconductor chip package. A back etching may be additionally carried out to the semiconductor chip package (ST5).

Figure 7:
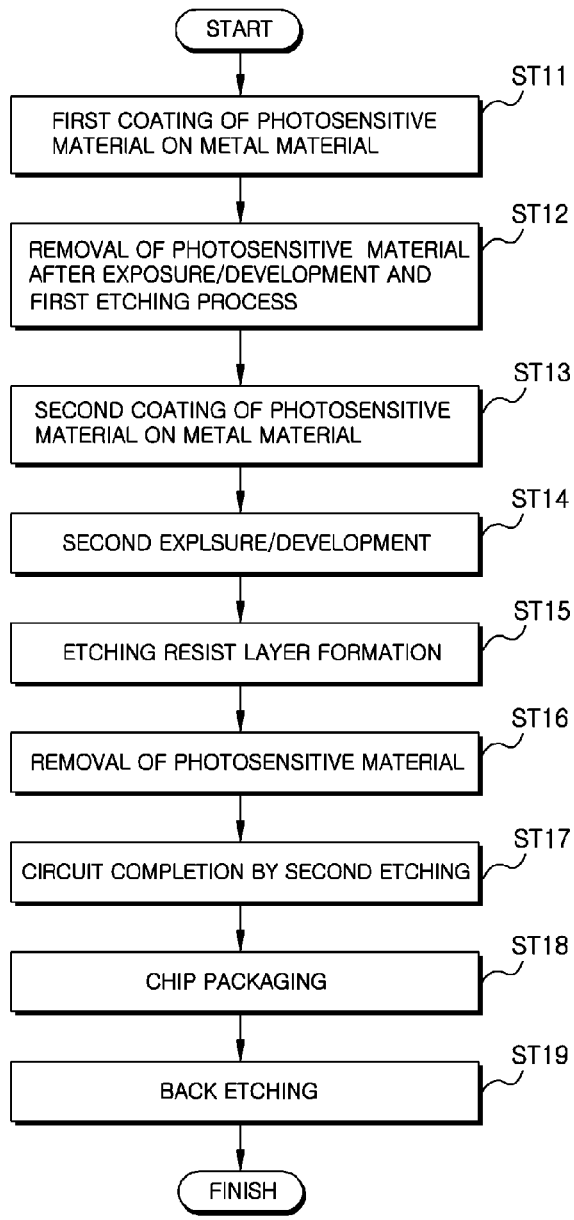
FIG. 7 is a flowchart illustrating a manufacturing method of a multi-row lead frame or a semiconductor chip package according to another exemplary embodiment of the present invention.

FIG. 7 is a flowchart illustrating a manufacturing method of a multi-row lead frame or a semiconductor chip package according to another exemplary embodiment of the present invention, and FIG. 8 is a process chart illustrating a manufacturing method of a multi-row lead frame or a semiconductor chip package according to another exemplary embodiment of the present invention.

First, referring to FIG. 8 (*a*), a photosensitive material (42) is initially coated on a metal material (41) which is a lead frame raw material. At this time, it is possible to form a pattern on both sides or a single side of the metal material (41). The photosensitive material (42) may be filmy or fluid photosensitive material (42).

Referring to FIG. 8(*b*), a first etching is conducted following the exposure and development to remove the photosensitive material (41), whereby a first pattern is formed on the metal material (41) (ST12).

Referring to FIG. 8(*c*-1), the filmy photosensitive material (42) is coated on the metal material (41) second time. At this time, it is possible to form a pattern on both sides or a single side of the metal material (41). Referring to FIG. 8 (*c*-2), the fluid photosensitive material (42) is coated on the metal material (41) second time (ST13).

Hereinafter, an exemplary embodiment will be described where a filmy photosensitive material is used in FIG. 8 (*c*-1). Then, an etching resist layer (43) of electrolytic or non-electrolytic plating is formed in FIG. 8 (*e*) (ST15). The filmy or fluid photosensitive material (42) is removed in FIG. 8 (*f*) (ST16).

An second etching is performed on the metal material (41) removed of the photosensitive material (42) and the etching resist layer (43) to form a second pattern on the metal material (41) in FIG. 8(*g*), whereby a semiconductor circuit is completed (ST17).

In the semiconductor circuit thus completed, a semiconductor chip (44) is bonded to an upper end of the metal material (41) mounted with the die pad portion (51) using adhesive, to which a wire bonding (45) and an epoxy molding (46) are carried out to constitute a semiconductor chip package (ST18). A back etching may be additionally carried out to the semiconductor chip package (ST19).

FIG. 9 is a conceptual drawing illustrating an example of a conventional type and that of a semiconductor chip embedding type in a multi-row lead frame according to the present invention, where FIG. 9(*a*) is a multi-row lead frame of conventional type, while FIG. 9(*b*) illustrates a multi-row lead frame of semiconductor chip embedded type.

With regard to the conventional type of FIG. 9 (*a*), a process according to the present invention may be selectively applied to an upper end and a lower end of the metal material (41), and various types of multi-row lead frames may be manufactured using a method of etching a portion where the semiconductor chip (44) is mounted or using a no-etching method.

Figure 10:
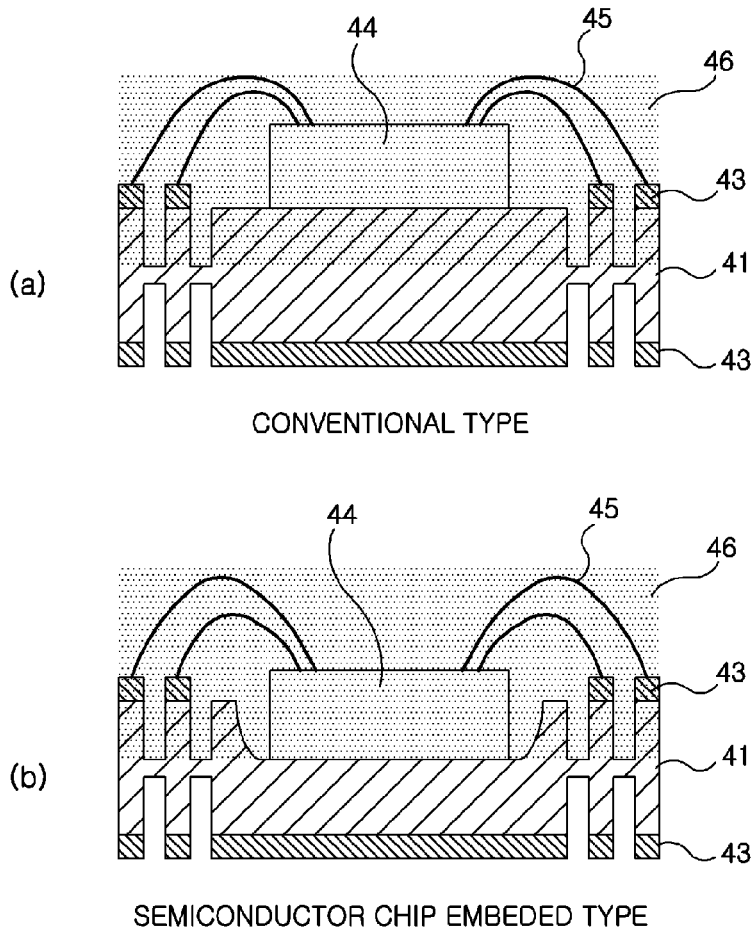
FIG. 10 is a conceptual drawing illustrating an example of a conventional type and that of a semiconductor chip embedding type in a semiconductor chip package according to the present invention.

FIG. 10 is a conceptual drawing illustrating an example of a conventional type and that of a semiconductor chip embedding type in a semiconductor chip package according to the present invention, where FIG. 10 (*a*) shows a semiconductor chip package of conventional type following the mounting, while FIG. 10 (*b*) illustrates a semiconductor chip package of semiconductor chip embedded type following the mounting.

Thus, a multi-row lead frame package may be constituted where each signal connector is constituted in multi-row pad types through a final etching applied to a lower section following the mounting of the semiconductor chip (44) and epoxy molding (46).

Figure 11:
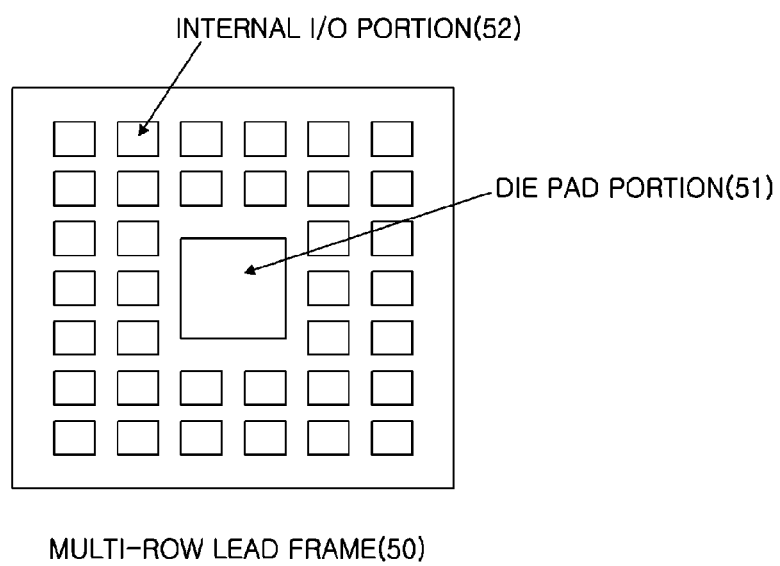
FIG. 11 is a plan of a multi-row lead frame or a semiconductor chip package according to the present invention.

FIG. 11 is a plan of a multi-row lead frame or a semiconductor chip package according to the present invention.

Thus, the present invention may be constituted including an etching resist layer (43) formed by electrolytic or non-electrolytic plating at a portion where a die pad portion (51) or an inner I/O portion (52) if formed on the metal material (41) of the multi-row lead frame (50).

Figure 12:
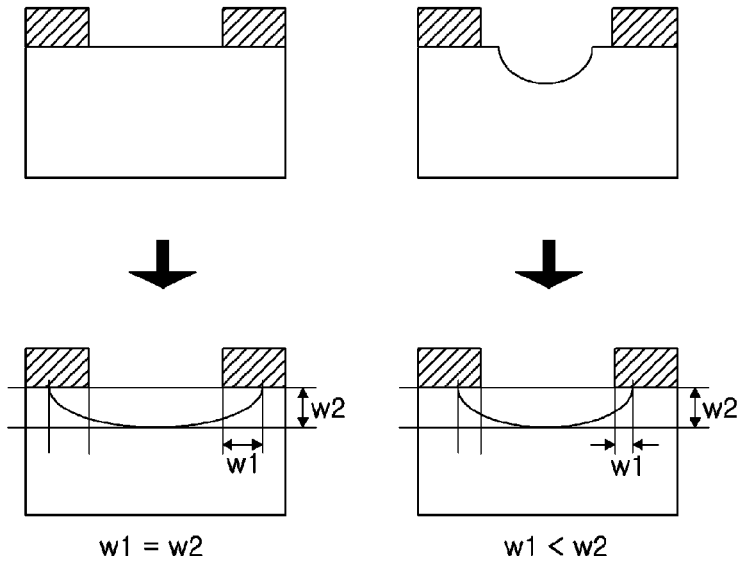
FIG. 12 is a drawing comparing the conventional technique with the present invention.

FIG. 12 is a drawing comparing the conventional technique with the present invention, where FIG. 12 (*a*) is an exemplary embodiment of performing an etching on an etching resist layer in the conventional art, and FIG. 12 (*b*) illustrates an exemplary embodiment of performing an etching on an etching resist layer in the present invention. Furthermore, 'w1' defines a length of an undercut formed at a lower end of the etching resist layer (43), and 'w2' represents an etched depth.

In the conventional art of FIG. 12 (*a*), a ratio between an etched depth (w2) and an undercut length (w1) is 1:1 due to etching performed on the etching resist layer, which is caused by generation of undercut where etching solution penetrates to a lateral surface of the etching resist layer in the same depth as etched into a metal when etching is performed using the etching resist layer.

However, in FIG. 12(b) of the present invention, an initial etching is performed, and then a second photosensitive material is formed on an upper tip end of an I/O pad or die pad portion to make it in the same way as shown in the enlarged portion of FIG. 5 (d), and an etching resist layer (43) is formed as in the enlarged portion of FIG. 5 (f), whereby a pattern may be formed with the undercut length (w1) smaller than the etched depth (w2). As evident from the foregoing, the undercut phenomenon may be minimized by applying the gradual etching in the first exemplary embodiment.

Second Exemplary Embodiment

The second exemplary embodiment intends to effectively prevent a pad loss or a dimensional shrinkage phenomenon that is generated by an undercut when a surface treatment layer is selectively formed following the etching process for a basic circuit and a semiconductor chip active element embedment and an anti-oxidation is treated.

In the present exemplary embodiment, a semiconductor substrate material (a metal material, a high polymer material or a material in which a copper thin plate is bonded to a core layer combined with high polymer and epoxy) is bonded by photosensitive liquid/filmy photo resist, a pad portion if formed by a die pad to be mounted with a multi-row I/O pad and a semiconductor chip through an exposure/development process, and the photo resist is removed following a selective etching (half etching). A structure may be formed capable of positioning a semiconductor chip on an upper surface of the semiconductor substrate or inside the semiconductor substrate using the process.

In a case of a core material of the semiconductor substrate in which epoxy and glass fiber are impregnated, or in a case of a core material of the semiconductor substrate in which polyimide material is bonded with a copper pad, a hole and a space, having a structure in which an active element can be embedded through etching and laser process following the circuit forming process, may be processed, and basically the following process is applied or utilized.

The material formed with a semiconductor chip and I/O pad forms an I/O pad and semiconductor chip pad portion for surface treatment plating for pattern by repeating the exposure/development process again using the photosensitive photoresist. At this time, the pad for an upper wiring bond and a bottom soldering may have a circular shape for embodying the multi-row and high density (below 0.4 pitch) in addition to the conventional shape.

The surface treatment plating may use a single alloy from one of an electrolyte or non-electrolyte Ni, Pd, Au, Sn, Ag, Co and Cu, or a binary alloy or ternary alloy, and may be in a single layer or a double layer.

The portion that is not plated in the surface treatment plating may be treated with anti tarnish following the surface treatment plating and photoresist separation process for preventing oxidation of raw materials. The substrate for semiconductor package protects a semiconductor chip from external heat or humidity that promotes oxidation of the material through the customer's assembly process (wire bonding and epoxy molding).

At this time, the bottom of the connected I/O and semiconductor chip mounted pad may become an independent pad according to complete etching process in response to the customer's design and internal process. That is, the pad may become an independent package mountable at a bottom of a semiconductor substrate through laser or mechanical process.

The present invention will be further described in detail with reference to the accompanying drawings, where the pad portion may be etched on both sides, or one side may be etched, exemplary embodiments of which will be centered on a process of forming a pattern portion following the etching of both sides.

Figure 13:
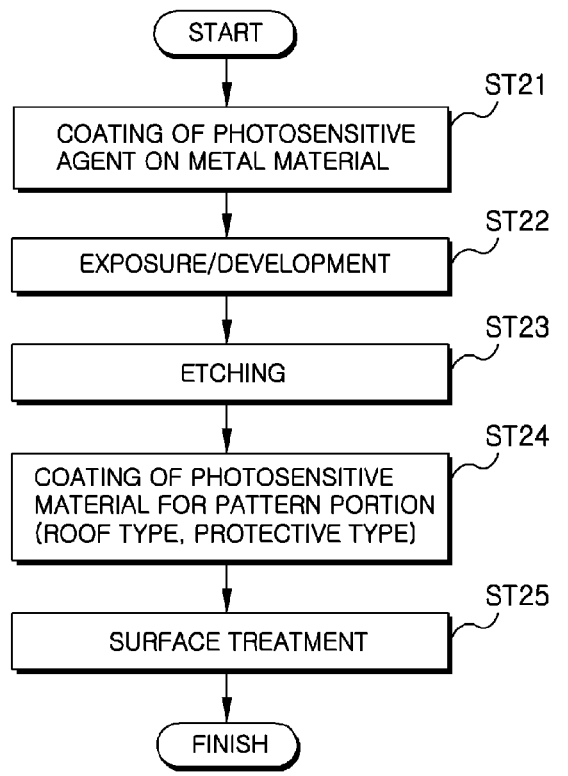
FIG. 13 is a flowchart illustrating a manufacturing method of an active element embedded type lead frame according to another exemplary embodiment of the present invention.
Figure 14:
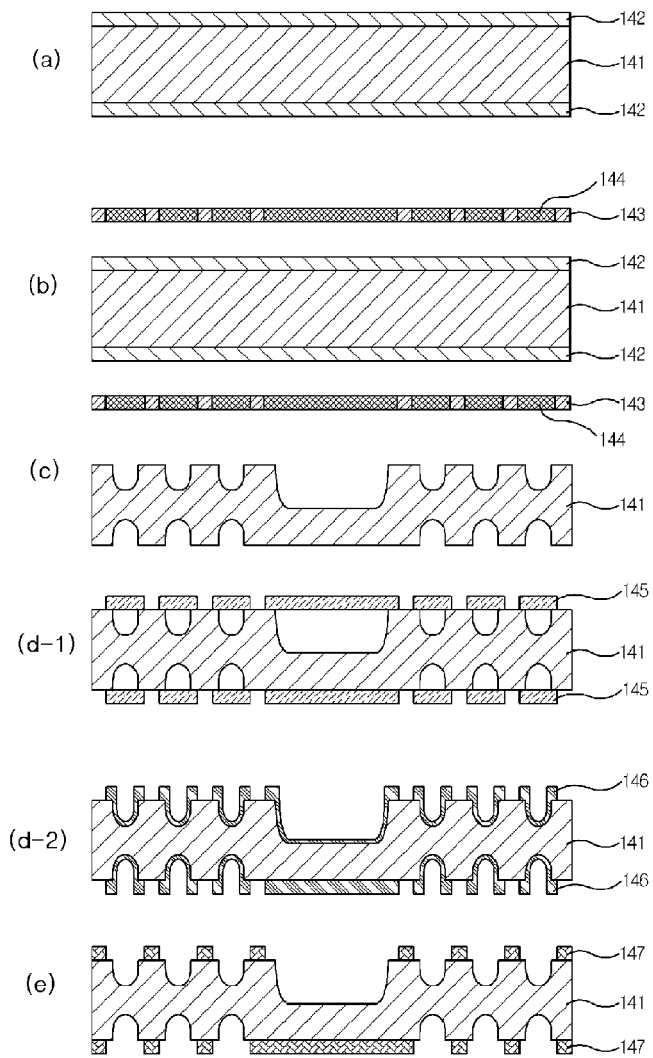
FIG. 14 is a conceptual drawing illustrating a manufacturing process according to the manufacturing method of an active element embedded type lead frame according to FIG. 13.

FIG. 13 is a flowchart illustrating a manufacturing method of an active element embedded type lead frame according to another exemplary embodiment of the present invention, and FIG. 14 is a conceptual drawing illustrating a manufacturing process according to the manufacturing method of an active element embedded type lead frame according to FIG. 13.

First, a metal material (141) is coated with photosensitive agent {142. see ST21 of FIG. 13 and FIG. 14(a)}, exposure and development (144) are performed using a mask (143) {see ST22 of FIG. 13 and FIG. 14(b), and etching is carried out to form a pad portion {152. see ST23 of FIG. 13 and FIG. 14(c)}.

Furthermore, photosensitive material for forming a pattern portion (147) is coated {145, 146. see ST24 of FIG. 13 and FIG. 14(d)} on the metal material (141), and surface treatment is performed to form a pattern portion (147) {see ST25 of FIG. 13 and FIG. 14(e)}. At this time, when the pattern portion (147) is formed, the width of the pattern portion (147) should be narrower than that of the pattern portion (152).

Furthermore, when the photosensitive material is coated, a roof-shaped material coating (145) is carried out as shown in FIG. 14 (d-1), or protective photosensitive material coating (146) may be carried out as shown in FIG. 14 (d-2).

A surface treatment plating is performed during surface treatment, where the plating may use a single alloy from one of an electrolyte or non-electrolyte Ni, Pd, Au, Sn, Ag, Co and Cu, or a binary alloy or ternary alloy, and may be in a single layer or a double layer.

Figure 15:
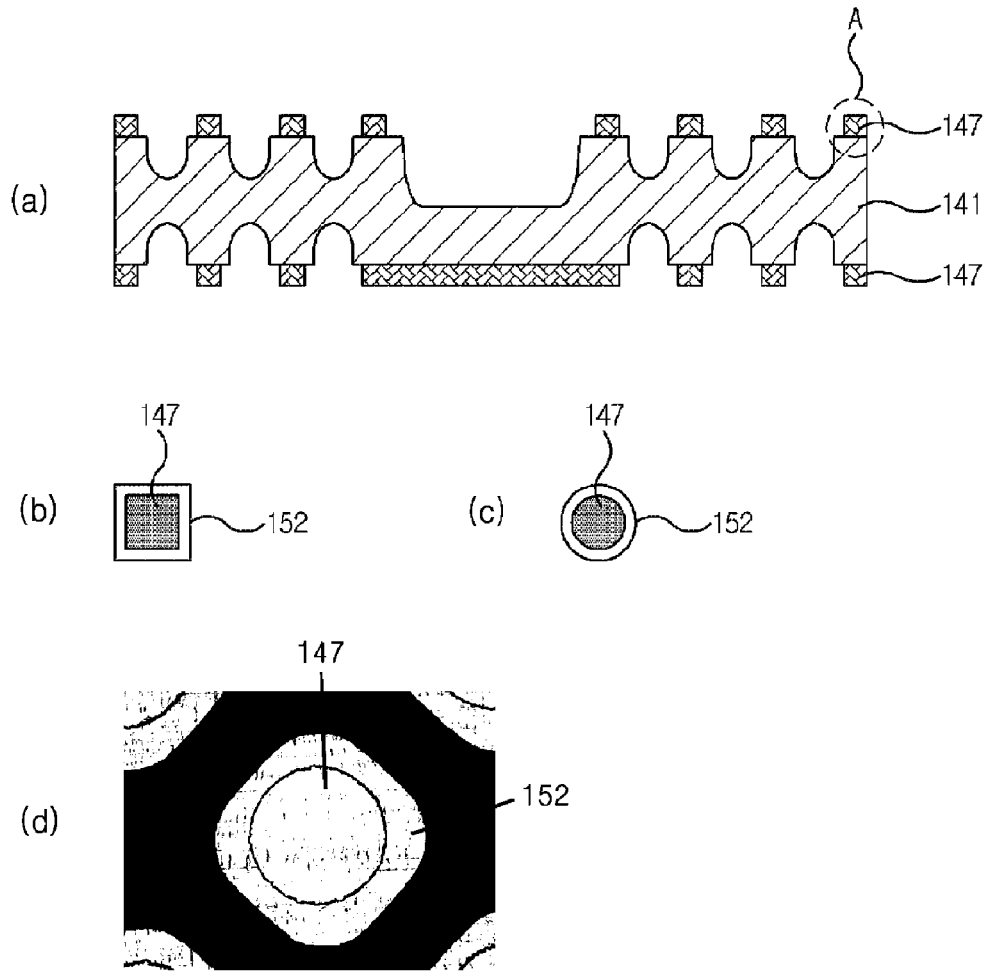
FIG. 15 is an enlarged conceptual drawing according to FIG. 14 (e).

FIG. 15 is an enlarged conceptual drawing according to FIG. 14 (e), where FIG. 15 (a) illustrates FIG. 14 (e), and FIGS. 15(b) and 15(c) illustrate a plain surface of "A" portion of FIG. 15 (a). The plain surface of "A" portion may be the conventional (square) type as illustrated in FIG. 15 (b), or a high density type (round) as shown in FIG. 15(c). FIG. 15 (d) illustrates exemplary embodiments relative to FIGS. 15(b) and (c).

Figure 16:
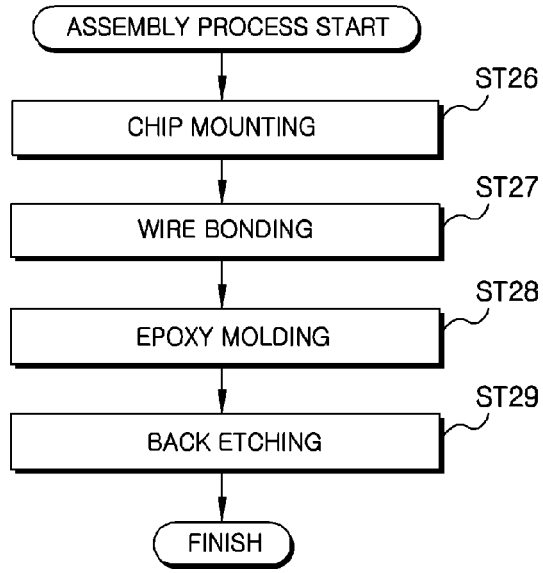
FIG. 16 is a flowchart illustrating a method of manufacturing a semiconductor package in an active element embedded lead frame by conducting an assembly process following the process of FIG. 13.
Figure 17:
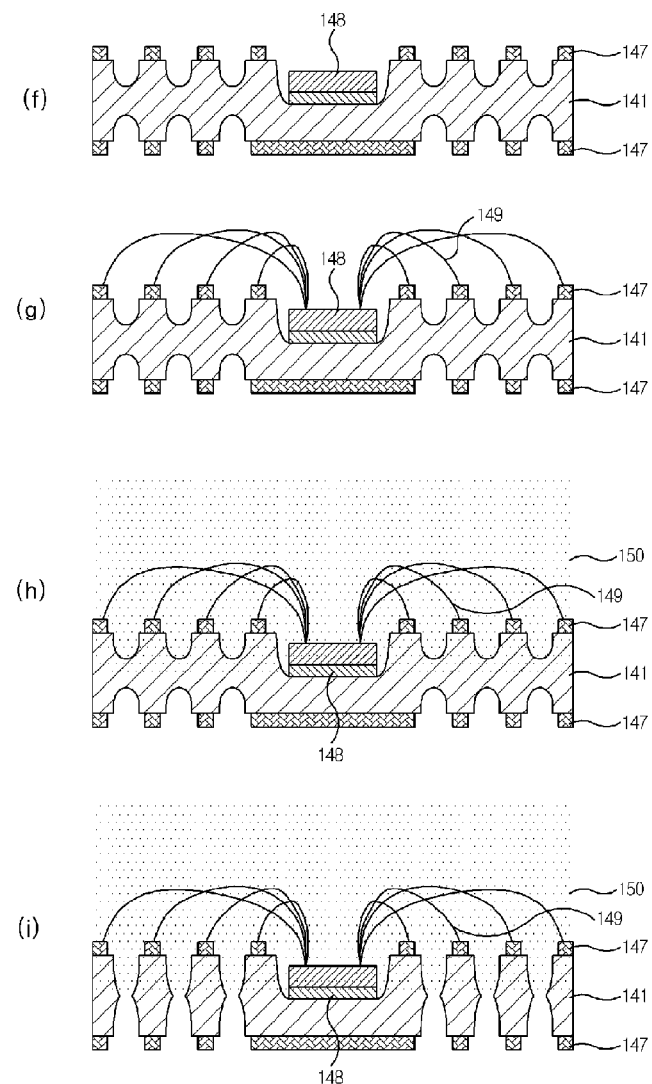
FIG. 17 is a conceptual drawing illustrating a manufacturing process according to the manufacturing method of semiconductor package in the active element embedded type lead frame of FIG. 16.

FIG. 16 is a flowchart illustrating a method of manufacturing a semiconductor package in an active element embedded lead frame by conducting an assembly process following the process of FIG. 13, and FIG. 17 is a conceptual drawing illustrating a manufacturing process according to the manufacturing method of semiconductor package in the active element embedded type lead frame of FIG. 16.

First, mounting of semiconductor chip {148. see ST26 of FIG. 16 and FIG. 17(f)}, wire bonding {149. see ST27 of FIG. 16 and FIG. 17(g)}, epoxy molding {150. see ST28 of FIG. 16 and FIG. 17(h)} and back etching {150. see ST29 of FIG. 16 and FIG. 17(i)} are carried out according to the assembly process.

The pad portion may be etched on both sides, or one side may be etched, exemplary embodiments of which will be centered on a process of forming a pattern portion following the etching of both sides.

Although the exemplary embodiment relates to a process of forming a pattern portion following the etching of both sides, the following exemplary embodiment will describe a process of forming a pattern portion following the etching of one side. That is, an upper surface is etched using a pattern, the upper and bottom surface are surface-treated using roof-shaped or protective photosensitive material to form a pattern portion. In this case, the upper surface is etched while the bottom surface is not etched, such that the bottom surface is etched following the epoxy molding.

Meanwhile, the active element embedded type lead frame according to an exemplary embodiment of the present invention may include a pad portion (152) formed on the metal material (141) and a pattern portion (147).

The pattern portion (147) is formed by plating on the pad portion (152), and is narrower than that of the pad portion (152). The plating on the pattern portion (147) may use a single alloy from one of an electrolyte or non-electrolyte Ni, Pd, Au, Sn, Ag, Co and Cu, or a binary alloy or ternary alloy, and may be in a single layer or a double layer.

Now, the semiconductor package may be constructed by mounting the semi-conductor chip (148) on the lead frame, carrying out the wire bonding (149), carrying out the epoxy molding (150) and performing the back etching.

Figure 18:
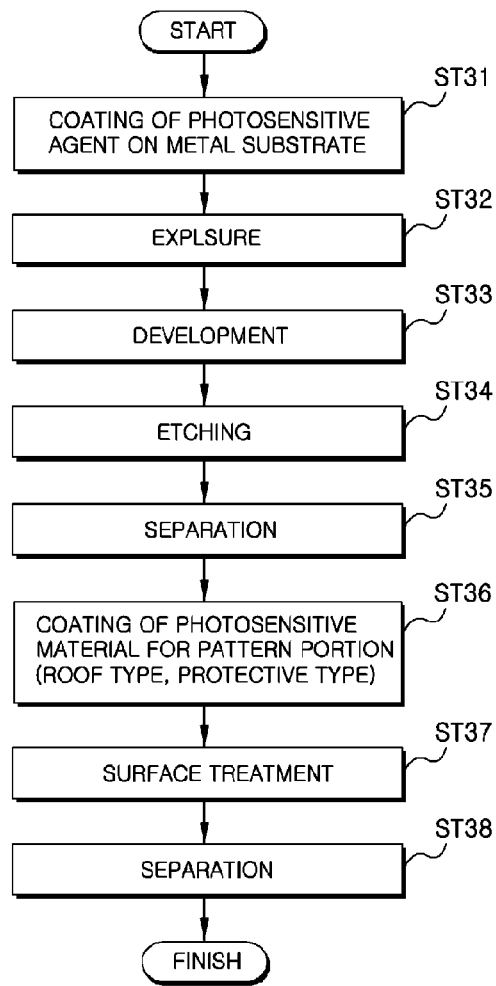
FIG. 18 is a flowchart illustrating a manufacturing method of an active element embedded type lead frame according to another exemplary embodiment of the present invention.
Figure 19:
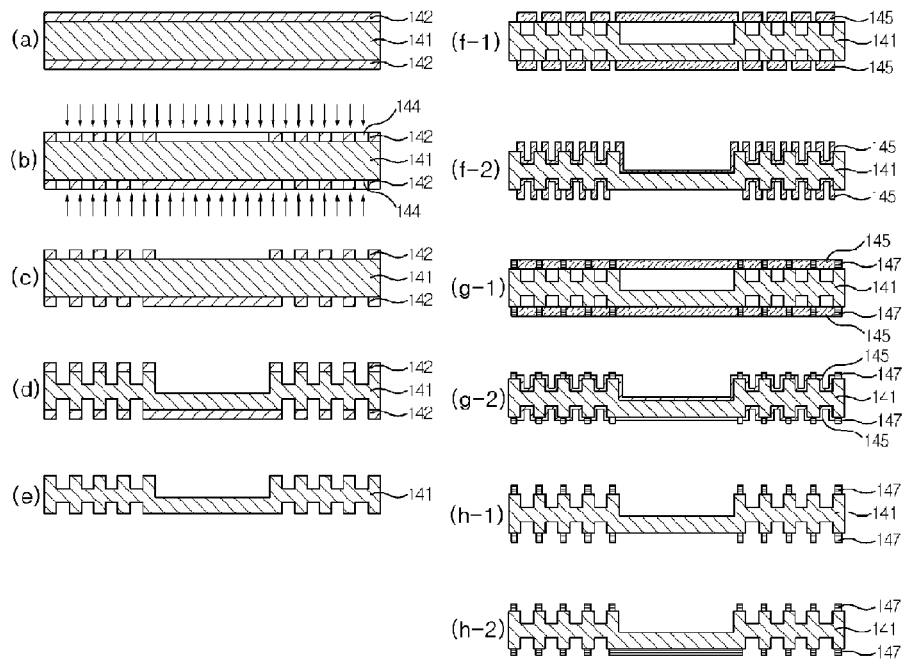
FIG. 19 is a conceptual drawing illustrating a manufacturing process according to the manufacturing method of the active element embedded type lead frame of FIG. 18.

FIG. 18 is a flowchart illustrating a manufacturing method of an active element embedded type lead frame according to another exemplary embodiment of the present invention, and FIG. 19 is a conceptual drawing illustrating a manufacturing process according to the manufacturing method of the active element embedded type lead frame of FIG. 18.

First, a metal substrate (141) is coated with photosensitive agent (142). At this time, the photosensitive agent (142) may be coated on both the upper surface and the bottom surface of the metal substrate (141), or either the upper surface or the bottom surface may be coated with the photosensitive agent (142) {see ST31 of FIG. 18 and FIG. 19(a)}. The exposure is performed using a mask (143) {see ST32 of FIG. 18 and FIG. 19(b)}, and development is performed {144. see ST33 of FIG. 18 and FIG. 19(c)}.

Thereafter, an initial etching is carried out, where a die pad portion may be caved in or protruded out {see ST34 of FIG. 18 and FIG. 19(d)}, and then a separation is carried out {see ST35 of FIG. 18 and FIG. 19(e)}. A second photosensitive material is coated {145, 146. see ST36 of FIG. 18 and FIG. 19(f)}, where FIG. 19 (f-1) shows a roof-shaped photosensitive material coating (145) while FIG. 19 (f-2) illustrates a protection type photosensitive material coating (146).

Furthermore, a plating (147) is carried out using the surface treatment {see ST37 of FIG. 18 and FIG. 19(g)}, where FIG. 19 (g-1) shows a roof-shaped photosensitive material coating (145) while FIG. 19 (g-2) illustrates a protection type photosensitive material coating (146). A separation is carried out {see ST38 of FIG. 18 and FIG. 19(h)}, where FIG. 19 (h-1) shows a separation by surface treatment of roof-shaped photosensitive material coating (145) while FIG. 19 (h-2) illustrates a separation by surface treatment of protection type photosensitive material coating (146).

FIG. 20 is an enlarged conceptual drawing of B part in (g-1), (g-2) (h-1) and (h-2) in FIG. 19, whereby it can be noted that the width (W1) of the pattern portion is narrower than that (W2) of the pad portion.

Figure 22:
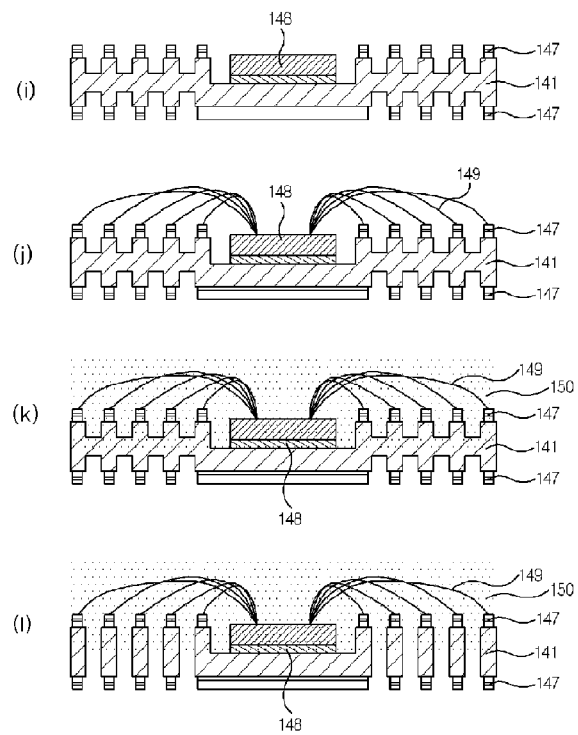
FIG. 22 is a conceptual drawing illustrating a manufacturing process according to the manufacturing method of semiconductor package in the active element embedded type lead frame of FIG. 21.

FIG. 21 is a flowchart illustrating a method of manufacturing a semiconductor package in the active element embedded lead frame by conducting an assembly process following the process of FIG. 18, and FIG. 22 is a conceptual drawing illustrating a manufacturing process according to the manufacturing method of semi-conductor package in the active element embedded type lead frame of FIG. 21.

First, mounting of semiconductor chip {148. see ST39 of FIG. 21 and FIG. 22(i)}, wire bonding {149. see ST40 of FIG. 21 and FIG. 22(j)}, epoxy molding {150. see ST41 of FIG. 21 and FIG. 22(k)} and back etching {150. see ST42 of FIG. 21 and FIG. 22(i)} are carried out according to the assembly process.

Thus, as apparent from the foregoing, the second exemplary embodiment can effectively prevent a pad loss or a dimensional shrinkage phenomenon that is generated by an undercut when a surface treatment layer is selectively formed following the etching process for a basic circuit and a semiconductor chip active element embedment and an anti-oxidation is treated.

Third Exemplary Embodiment

The third exemplary embodiment intends to provide a manufacture method for multi-row lead frame and semiconductor package capable of using a sheeted etching product dispensing with a first etching product in which strip is cut off for pattern formation, whereby alignment can be easily performed, fine pattern formation for input/output terminal can be facilitated to prevent occurrence of undercut phenomenon and processional application is eased to increase the process pace.

Figure 23:
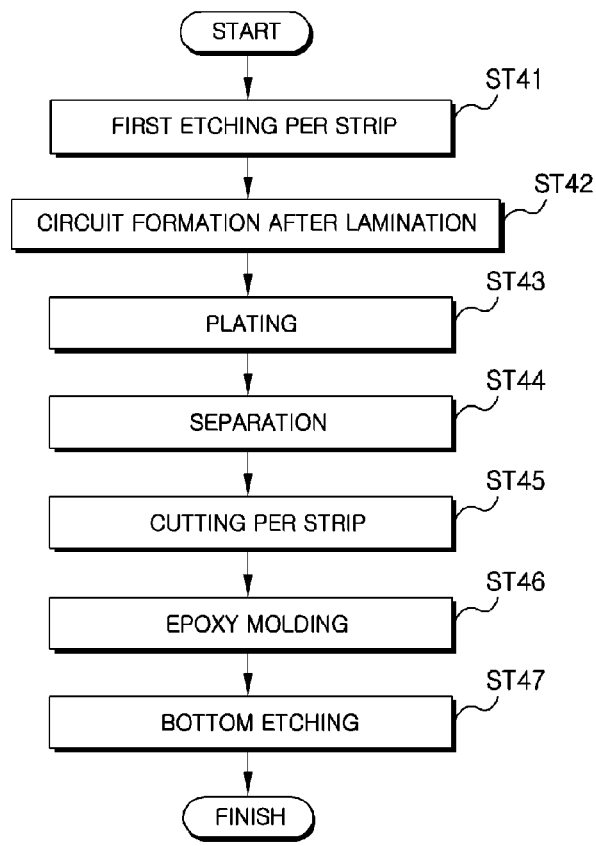
FIG. 23 is a flowchart illustrating a manufacturing method of a multi-row lead frame and a semiconductor package according to still another exemplary embodiment of the present invention.

FIG. 23 is a flowchart illustrating a manufacturing method of a multi-row lead frame and a semiconductor package according to still another exemplary embodiment of the present invention.

Patterns are formed per sheet, instead of forming pattern per strip when an initial etching is carried out for the leadless frame, whereby an initial etching is performed (ST41). The first etching product formed with the pattern is formed with a circuit using liquid or dry film resist (ST42), on which a desired pattern is formed and a plating is performed (ST43). The plating resist is removed by separation (ST44).

Furthermore, cutting is carried out per strip (ST45), where punching, routing, laser cutting and/or lithography are used to perform the cutting process per strip. Then, epoxy molding is carried out following the semiconductor chip mounting and wire bonding to form a semiconductor package, whereby reliability can be improved (ST46). The bottom is completely etched following the molding to proceed to the bottom etching for forming an independent I/O terminal (ST47).

Figure 24:
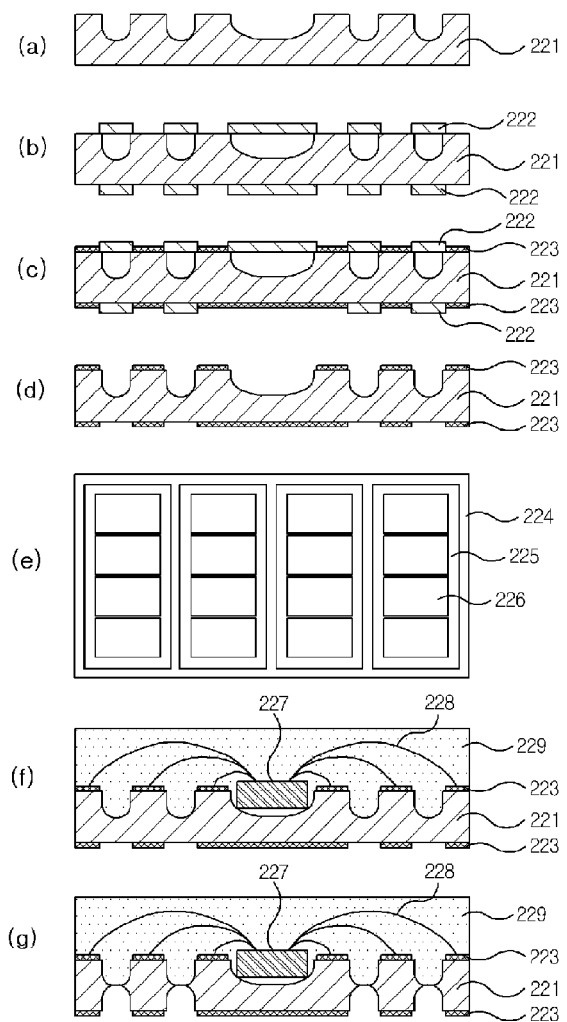
FIG. 24 is a conceptual drawing illustrating a manufacturing process of FIG. 23.

FIG. 24 is a conceptual drawing illustrating a manufacturing process of FIG. 23.

First, as shown in FIG. 24 (a), in a case when a metal material (221) is utilized to manufacture a multi-row leadless frame, a pattern is formed per sheet, instead of pattern formation per strip during an initial etching, to carry out the first etching.

Referring to FIG. 24 (b), a both-side lamination (222) is performed on the first etching product formed with the pattern to form a circuit using liquid or dry film resist. Now, referring to FIG. 24(c), a desired pattern is formed and plating is carried out to form a plating layer (223). Referring to FIG. 24 (d), plating resist is removed using separation or detachment. Referring to FIG. 24 (e), cutting is carried out per strip (ST45), where punching, routing, laser cutting and/or lithography are used to perform the cutting process per strip.

Then, referring to FIG. 24(f), epoxy molding (229) is carried out following the semi-conductor chip (227) mounting and wire bonding (228) to form a semiconductor package, whereby reliability can be improved. Referring to FIG. 24 (g), the bottom is completely etched following the molding to proceed to the bottom etching for forming an independent I/O terminal.

FIG. 25 is a plan of a first etching product from a sheet in FIG. 24(a), where reference numeral 224 is a sheet, 225 is a strip-cut portion, 226 defines a plurality of semi-conductor packages and reference numeral 230 represents a semiconductor package within the plurality of semiconductor packages.

Although a strip-cut etching product was used during performance of first etching in the conventional method, the present invention uses one complete sheet as a first etching product.

FIG. 26(*a*) is an exemplary drawing that forms a pattern using one complete sheet separated per strip according to the conventional method, and FIG. 26(*b*) is an exemplary drawing that forms a pattern using one complete sheet according to the present invention, where reference numeral 231 is a pattern portion formed by the metal material (221), and reference numeral 232 defines a pad portion formed by the plating layer (223).

Thus, although an alignment bias is 38.67 um if a pattern is formed using a sheet separated per strip as shown in FIG. 26 (*a*), the alignment bias is now 1.73 um if a pattern is formed using one complete sheet as depicted in FIG. 26 (*b*) to thereby obtain an excellent performance over the conventional method.

Figure 27:
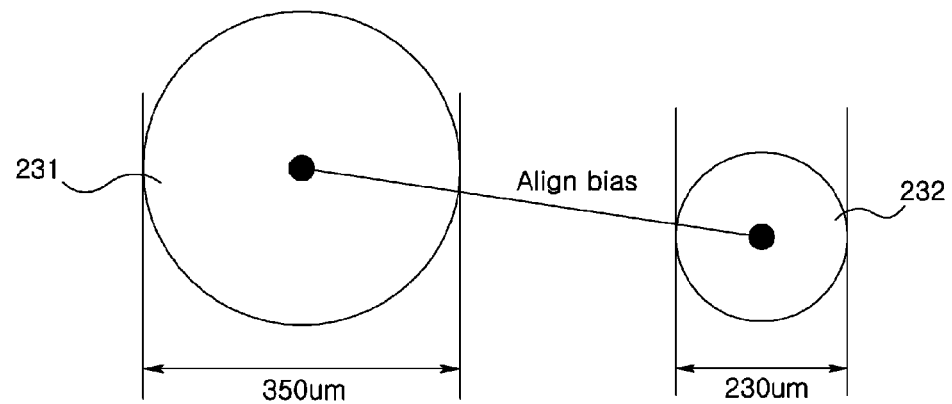
FIG. 27 is a conceptual drawing explaining if an alignment is properly performed in FIG. 26(a).

FIG. 27 is a conceptual drawing explaining if an alignment is properly performed in FIG. 26(*a*), where the alignment bias defines a distance between a center point of the pattern portion (231) and a center point of the pad portion (232).

Therefore, a current alignment bias is a distance between a center point of 230 um pad portion (232) and a center point of 350 um pattern portion (231). Therefore, in a case that the pattern portion (231) and the pad portion (232) are coupled as shown in FIG. 26 (*b*), the alignment bias should be controlled within approximately 20 um. As a result, if the pattern separated per strip is formed as in the conventional method, there arises a problem that deviates from the specification.

In the present exemplary embodiment, the pattern is formed by the sheet type first etching product, where cutting is performed per sheet using punching, routing, laser cutting and/or lithography method during assembly process, and where the alignment bias formed by the pattern portion (231) and the pad portion (232) is made to be less than 38.67 um, and where a pattern width divided by the alignment bias is made to be less than 0.11 (alignment bias 38.67 um/pattern width 350 um=0.11048).

As noted above, the third exemplary embodiment can provide a manufacture method for multi-row lead frame and semiconductor package capable of using a sheeted etching product dispensing with a first etching product in which strip is cut off for pattern formation, whereby alignment can be easily performed, fine pattern formation for input/output terminal can be facilitated to prevent occurrence of undercut phenomenon and processional application is eased to increase the process pace.

The foregoing written specification is to be considered to be sufficient to enable one skilled in the art to practice the invention. While the best mode for carrying out the invention has been described in detail, those skilled in the art to which this invention relates will recognize various alternative embodiments including those mentioned above as defined by the following claims The exemplary embodiments disclosed herein are not to be construed as limiting of the invention as they are intended merely as illustrative of particular embodiments of the invention as enabled herein. Therefore, structures and methods that are functionally equivalent to those described herein are within the spirit and scope of the claims appended hereto. Indeed, various modifications of the invention hi addition to those shown and described herein will become apparent to those skilled in the art from the foregoing description and fall within the scope of the appended claims.

INDUSTRIAL APPLICABILITY

A leadless chip carrier lead frame that has gone through the manufacturing method according to the present invention is not formed by plating, unlike the conventional lead frame, and carrier material that is used in the plating process is not completely removed to thereby increase the quality, productivity and cost reduction.

A gap between a die pad portion and a lead is narrowed to enable a cost reduction and an improved electric characteristic, whereby it is possible to easily increase the number of terminals at a space formed between the die pad portion and the lead, which means that multiplication of terminals is possible.

A lead frame manufacturing method by the conventional etching is modified to thereby enable manufacturing of multi-row lead frames, whereby a new investment burden for manufacturing multi-row lead frames can be minimized.

A multi-row lead frame can greatly reduce the size and weight of lead frame compared with the conventional lead frame, and introduction of various surface treatment enables manufacturing of various lead frames such as flip chip lead frame and leadframe for system in package.

Etching and gradual selective etching are applied to enable realization of a circuit-width with minimized undercut.

An upper side and a bottom side are coated with functional (alkali-resistant, acid-resistant) photosensitive polymer material to enable the pattern plating using various surface treatments.

Surface treatment layer is selectively formed and anti-oxidation is treated after an etching process for embedding a basic circuit and semiconductor chip active element to effectively prevent pad loss and dimensional shrinkage that are caused by undercut phenomenon.

Embedment of active element enables increased thickness and package density of final semiconductor package in the semiconductor package substrate that has gone through the manufacturing method according to the present invention, whereby a substrate having an excellent thermal discharge and electrical characteristic can be manufactured.

A semiconductor substrate in which a copper thin film is bonded to a core layer coupled with high polymer and high polymer plus epoxy can have a structure having a cavity-shaped hole and space through etching and laser processing following the circuit formation process.

A semiconductor package substrate can be manufactured in which a round pad formed by pattern surface treatment plating is introduced to realize a high-density circuit in a limited pad size.

An undercut phenomenon at the pad bottom caused by etching can be completely removed, apart from the conventional method of etching after the resist formation, such that pad shrinkage resulted from pad loss and undercut generated in the conventional process can be effectively prevented.

A sheeted etching product is utilized instead of a strip-cut first etching product for pattern formation to facilitate the alignment, whereby an easily-applicable, fast manufacturing method can be provided that is capable of forming fine pattern in the input/output terminal dispensing with the undercut phenomenon.

The invention claimed is:

1. A lead frame that is a vertical lead-shaped lead frame for mounting an active element, the lead frame characterized by:
   a metal material formed with a pad portion which becomes a vertical lead in the device mounting process; and
   a pattern layer formed by electrolyte or non-electrolyte plating on the pad portion, wherein the pattern layer is configured in such a way that an undercut length is formed smaller than an etched depth of the lower metal material, and wherein a lower surface of the pattern layer in which the undercut is formed is exposed.

2. A lead frame for mounting an active element, characterized by:

a metal material formed with a pad portion which becomes a lead in the element mounting process; and a pattern layer formed on the pad portion by electrolyte or non-electrolyte plating, where an alignment bias formed by a central point of the pattern layer and that of the pad portion is less than 38.67 μm, wherein an undercut length of the pattern layer is formed smaller than an etched depth of the metal material, and wherein a lower surface of the pattern layer in which the undercut is formed is exposed.

3. The lead frame of claim 2, where a ratio of the alignment bias to pattern width is less than 0.11.

* * * * *